(12) United States Patent
Fouquet et al.

(10) Patent No.: US 9,631,519 B2
(45) Date of Patent: Apr. 25, 2017

(54) METHOD FOR THE PRODUCTION OF A CURVED CERAMIC SOUND ATTENUATION PANEL

(71) Applicant: HERAKLES, Le Haillan (FR)

(72) Inventors: Stéphanie Fouquet, Saint Medard en Jalles (FR); Sébastien Jimenez, Bordeaux (FR); Eric Philippe, Merignac (FR); Eddy Goulliane, Saint Medard en Jalles (FR)

(73) Assignee: HERAKLES, Le Haillan (FR)

( * ) Notice: Subject to any disclaimer, the term of this patent is extended or adjusted under 35 U.S.C. 154(b) by 0 days.

(21) Appl. No.: 14/764,052

(22) PCT Filed: Jan. 29, 2014

(86) PCT No.: PCT/EP2014/051698
§ 371 (c)(1),
(2) Date: Jul. 28, 2015

(87) PCT Pub. No.: WO2014/118216
PCT Pub. Date: Aug. 7, 2014

(65) Prior Publication Data
US 2016/0003106 A1    Jan. 7, 2016

(30) Foreign Application Priority Data

Jan. 29, 2013  (FR) ...................... 13 50723

(51) Int. Cl.
*C04B 35/524* (2006.01)
*F01D 25/30* (2006.01)
(Continued)

(52) U.S. Cl.
CPC .............. *F01D 25/30* (2013.01); *B32B 18/00* (2013.01); *C04B 35/111* (2013.01);
(Continued)

(58) Field of Classification Search
None
See application file for complete search history.

(56) References Cited

U.S. PATENT DOCUMENTS 4,772,502 A * 9/1988 Okura ...................... C04B 35/83
428/293.4
5,415,715 A    5/1995 Delage et al.
(Continued)

FOREIGN PATENT DOCUMENTS

EP    0 573 353 A1    12/1993
EP    0 611 741 A1    8/1994
(Continued)

OTHER PUBLICATIONS

International Search Report as issued in International Patent Application No. PCT/EP2014/051698, dated Apr. 22, 2014.

*Primary Examiner* — Joseph Miller, Jr.
(74) *Attorney, Agent, or Firm* — Pillsbury Winthrop Shaw Pittman LLP

(57) ABSTRACT

A method of fabricating a sound attenuation panel of curved shape, the method including impregnating a fiber structure defining a cellular structure with a ceramic precursor resin; polymerizing the ceramic precursor resin while holding the fiber structure on tooling presenting a curved shape corresponding to the final shape of the cellular structure; docking the cellular structure with first and second skins, each formed by a fiber structure impregnated with a ceramic precursor resin, each skin being docked to the cellular structure before or after polymerizing the resin of the skins; pyrolyzing the assembly constituted by the cellular structure and the first and second skins; and densifying the assembly by chemical vapor infiltration.

20 Claims, 11 Drawing Sheets

(51) Int. Cl.
*B32B 18/00* (2006.01)
*C04B 35/111* (2006.01)
*C04B 35/571* (2006.01)
*C04B 35/573* (2006.01)
*C04B 35/80* (2006.01)
*C04B 35/83* (2006.01)
*C04B 37/00* (2006.01)
*F02K 1/82* (2006.01)
*G10K 11/172* (2006.01)
*F02C 7/045* (2006.01)
*C23C 16/04* (2006.01)

(52) U.S. Cl.
CPC .......... *C04B 35/524* (2013.01); *C04B 35/571* (2013.01); *C04B 35/573* (2013.01); *C04B 35/803* (2013.01); *C04B 35/806* (2013.01); *C04B 35/83* (2013.01); *C04B 37/001* (2013.01); *C04B 37/005* (2013.01); *C04B 37/008* (2013.01); *C23C 16/045* (2013.01); *F02C 7/045* (2013.01); *F02K 1/827* (2013.01); *G10K 11/172* (2013.01); *C04B 2235/48* (2013.01); *C04B 2235/483* (2013.01); *C04B 2235/5224* (2013.01); *C04B 2235/5244* (2013.01); *C04B 2235/5248* (2013.01); *C04B 2235/5252* (2013.01); *C04B 2235/5256* (2013.01); *C04B 2235/614* (2013.01); *C04B 2235/616* (2013.01); *C04B 2237/083* (2013.01); *C04B 2237/343* (2013.01); *C04B 2237/365* (2013.01); *C04B 2237/38* (2013.01); *C04B 2237/385* (2013.01); *C04B 2237/62* (2013.01); *C04B 2237/76* (2013.01); *F05D 2220/32* (2013.01); *F05D 2250/283* (2013.01); *F05D 2260/96* (2013.01); *F05D 2300/437* (2013.01); *F05D 2300/6033* (2013.01); *Y02T 50/672* (2013.01)

(56) References Cited

U.S. PATENT DOCUMENTS

| | | | | |
|---|---|---|---|---|
| 5,514,445 | A | * 5/1996 | Delage | B29D 99/0089 428/116 |
| 5,893,955 | A | * 4/1999 | Rousseau | C04B 35/83 156/292 |
| 5,912,442 | A | 6/1999 | Nye et al. | |
| 8,043,690 | B2 | 10/2011 | Hand et al. | |
| 2009/0263627 | A1 | 10/2009 | Hand et al. | |
| 2010/0015428 | A1* | 1/2010 | Philippe | C04B 35/571 428/293.4 |
| 2011/0311368 | A1* | 12/2011 | Coupe | B29C 70/222 416/241 A |

FOREIGN PATENT DOCUMENTS

| | | |
|---|---|---|
| EP | 0 796 829 A1 | 9/1997 |
| GB | 2 314 526 A | 1/1998 |
| WO | WO 2010/061140 A1 | 6/2010 |

* cited by examiner

METHOD FOR THE PRODUCTION OF A CURVED CERAMIC SOUND ATTENUATION PANEL

CROSS REFERENCE TO RELATED APPLICATIONS

This application is the U.S. National Stage of PCT/EP2014/051698 filed Jan. 29, 2014, which in turn claims priority to French Application No. 1350723 filed Jan. 29, 2013. The contents of both applications are incorporated herein by reference in their entirety.

BACKGROUND OF THE INVENTION

The present invention relates to the general field of sound attenuation panels. More particularly, it relates to sound attenuation panels used for reducing the noise produced by aeroengines such as gas turbines or their exhausts.

In order to reduce noise in the exhaust ducts of gas turbines, it is known to provide the surfaces of elements defining such ducts with sound attenuation panels. Those panels are typically constituted by a wall having a multiply-perforated surface that is permeable to the soundwaves it is desired to attenuate, and by a reflecting solid wall, with a cellular structure, such as a honeycomb or a porous structure, being arranged between those two walls. In well-known manner, such panels form Helmholtz type resonators that serve to attenuate a certain frequency range of the soundwaves produced in the duct.

The component elements of that type of panel (walls and cellular body) are generally made out of metal material, as described in Documents U.S. Pat. No. 5,912,442 and GB 2 314 526. Nevertheless, in technical fields where saving weight is a constant concern, such as in aviation, the use of sound attenuation panels made of metal material is relatively penalizing.

Document U.S. Pat. No. 8,043,690 describes a sound attenuation panel having its walls and its cellular body made from composite materials (fiber reinforcement densified by a matrix), thereby achieving weight savings compared with the metal materials conventionally used. Nevertheless, that document discloses only panels or panel subassemblies that are plane in shape, so that providing a part of cylindrical or frustoconical shape with acoustic treatment requires a plurality of sound attenuation subassemblies that are of plane or rectilinear shape to be arranged on the wall of the part. That fabrication technique requires a large number of operations to make the acoustic panel from plane subassemblies, thereby penalizing the optimization and the costs involved in fabricating the panel.

There exists a need to have a solution enabling sound attenuation panels to be made out of composite material, and in particular out of ceramic matrix composite (CMC) material, and that presents a shape that is curved, matching the shape of the part that is to be sound proofed.

OBJECT AND SUMMARY OF THE INVENTION

To this end, the present invention provides a method of fabricating a sound attenuation panel made of ceramic matrix composite (CMC) material of curved shape, the method comprises the following steps:

impregnating a fiber structure defining a cellular structure with a ceramic precursor resin;
polymerizing the ceramic precursor resin while holding the fiber structure of the cellular structure on tooling presenting a curved shape corresponding to the final shape of the cellular structure;
docking the cellular structure with first and second skins so as to close the cells of said structure, each skin being formed by a fiber structure impregnated with a ceramic precursor resin, each skin being docked to said cellular structure before or after polymerizing the resin of said skins;
pyrolyzing the assembly constituted by the cellular structure and the first and second skins; and
densifying said assembly by chemical vapor infiltration (CVI).

Thus, in accordance with the method of the invention, a cellular structure is made initially and it is consolidated in the desired curved shape by polymerizing the impregnation resin. At this stage, i.e. after polymerization and before transformation of the resin into ceramic by pyrolysis, the cellular structure presents sufficient stiffness to be self-supporting and to conserve its curved shape, while still having a certain amount of flexibility or deformability. Likewise, the skins are assembled to the cellular structure while they are in the impregnated stage or the polymerized stage, i.e. prior to pyrolyzing their impregnation resin. It is thus possible to make sound attenuation panels out of CMC material with curved shapes that accurately match the shape of the part in which they are to be incorporated.

When the component parts of the acoustic panel are assembled together while they are in the impregnated stage, they still present flexibility or deformability that makes it possible to reduce clearances between the parts that are to be assembled together, which makes it possible to comply better with shape tolerances for the final acoustic panel that is to be made.

In addition, the consolidated cellular structure acts as a holding and shaping support for the skins, thereby enabling those elements to be pyrolized and densified without any need to use shaping tooling, thus consequently reducing the cost of fabricating the sound attenuation panel.

Densifying the elements of the acoustic panel in common (co-densification) by CVI serves to strengthen the bonding between those elements.

In a first aspect of the method of the invention, at least one of the two skins is docked to the cellular structure prior to polymerizing the impregnation resin of the skin, the method including a step of polymerizing the resin of the skin after the docking step and before the pyrolysis step.

In a second aspect of the method of the invention, one of the two skins is placed on tooling having needles passing through the skin, the cellular structure being docked with said skin placed on the tooling so as to make perforations in said skin. Therefore, perforations are made in the acoustic skin and simultaneously said skin is assembled with the cellular structure.

In a third aspect of the method of the invention, the resin of at least one of the two skins is polymerized before docking with the cellular structure, said skin being held during polymerization on tooling that presents a curved shape similar to the curved shape of the cellular structure, and in that an adhesive including at least a ceramic precursor resin is placed on the portions of the cellular structure that are to come into contact with the skin.

In a fourth aspect of the method of the invention, the adhesive further includes a solid filler constituted by a powder of a refractory material.

In a fifth aspect of the method of the invention, the first skin is docked to the cellular structure after its impregnation resin has been polymerized, and, prior to docking the second skin to the cellular structure, the method includes a step of making multiple perforations in the first skin, the second skin being docked to the cellular structure after said step of making multiple perforations.

In a sixth aspect of the method of the invention, the method includes making an expandable fiber structure defining a cellular structure. The expandable fiber structure may in particular be made by three-dimensional weaving or by multilayer weaving.

The cellular body and the associated skins are made of thermostructural composite material, i.e. a composite material, and in particular a carbon/carbon composite material or a ceramic matrix composite material. When these elements are made of ceramic matrix composite material, the fiber structures of the cellular body and of the skins may be made in particular using silicon carbide fibers, while the impregnation resin of the cellular structure and of the skins may be a silicon carbide precursor resin, and in that the densification step comprises chemical vapor infiltration of silicon carbide.

BRIEF DESCRIPTION OF THE DRAWINGS

Other characteristics and advantages of the invention appear from the following description of particular embodiments of the invention given as non-limiting examples and with reference to the accompanying drawings, in which.

DETAILED DESCRIPTION OF AN EMBODIMENT

The sound attenuation panel of the invention, or more precisely the elements that make it up, are made of thermostructural composite material, i.e. of a composite material having good mechanical properties and the ability to conserve these properties at high temperature. Typical thermostructural composite materials are carbon/carbon (C/C) composite materials formed by carbon fiber reinforcement densified with a carbon matrix, and ceramic matrix composite (CMC) materials formed by refractory fiber reinforcement (carbon or of ceramic fibers) densified by a matrix that is ceramic, at least in part. Examples of CMCs are C/SiC composites (carbon fiber reinforcement and silicon carbide matrix), C/C—SiC composites (carbon fiber reinforcement and a matrix comprising both a carbon phase, generally closer to the fibers, and a silicon carbide phase), and SiC/SiC composites (reinforcing fibers and matrix both made of silicon carbide), and oxide/oxide composites (reinforcing fibers and matrix both made of alumina). An interphase layer may be interposed between the reinforcing fibers and the matrix in order to improve the mechanical strength of the material.

Fabricating parts out of thermostructural composite material is well known.

Figure 1:
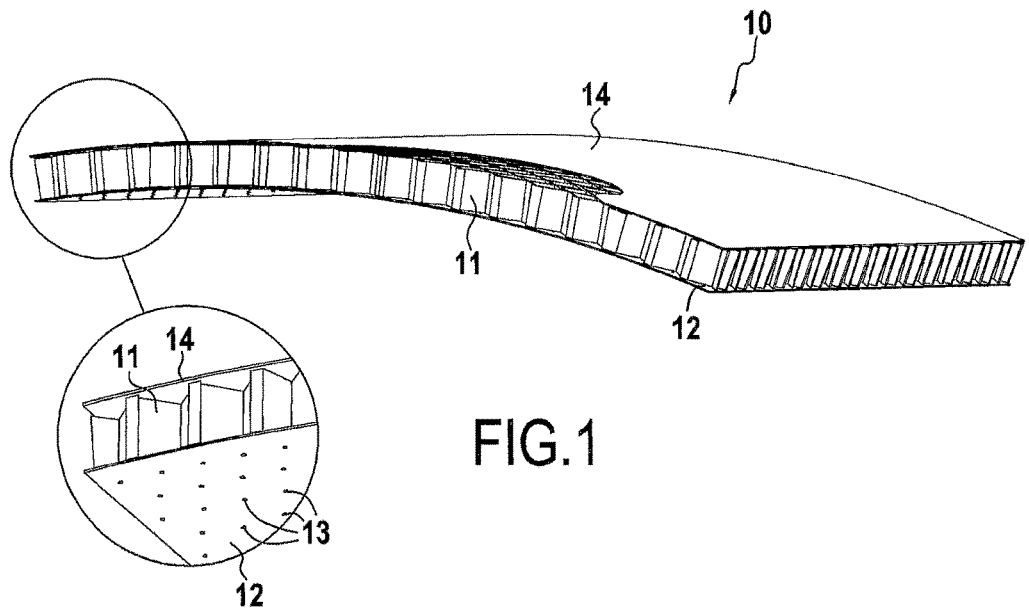
FIG. 1 is a diagrammatic perspective view of a sound attenuation panel of shape that has been curved in accordance with an implementation of the invention.

FIG. 1 shows a sound attenuation panel 10 having a cellular structure 11 arranged between an acoustic skin 12 having perforations 13 and a structural skin 14, all of these elements in the presently-described example being made out of CMC material.

Figure 3:
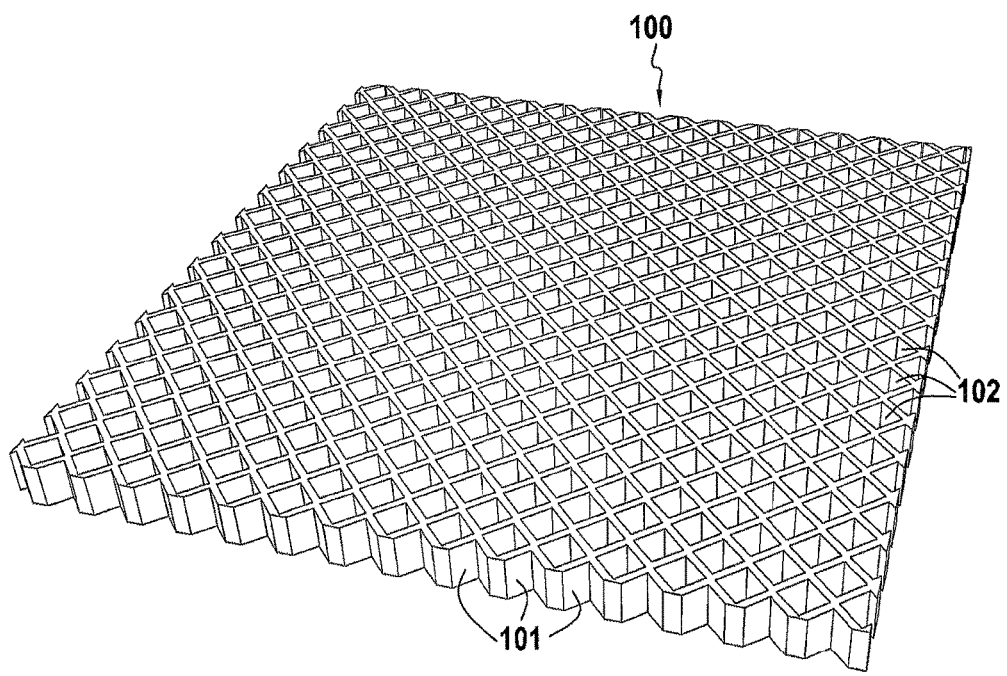
FIG. 3 is a diagrammatic perspective view of an expandable fiber structure used for making a cellular structure.
Figure 2:
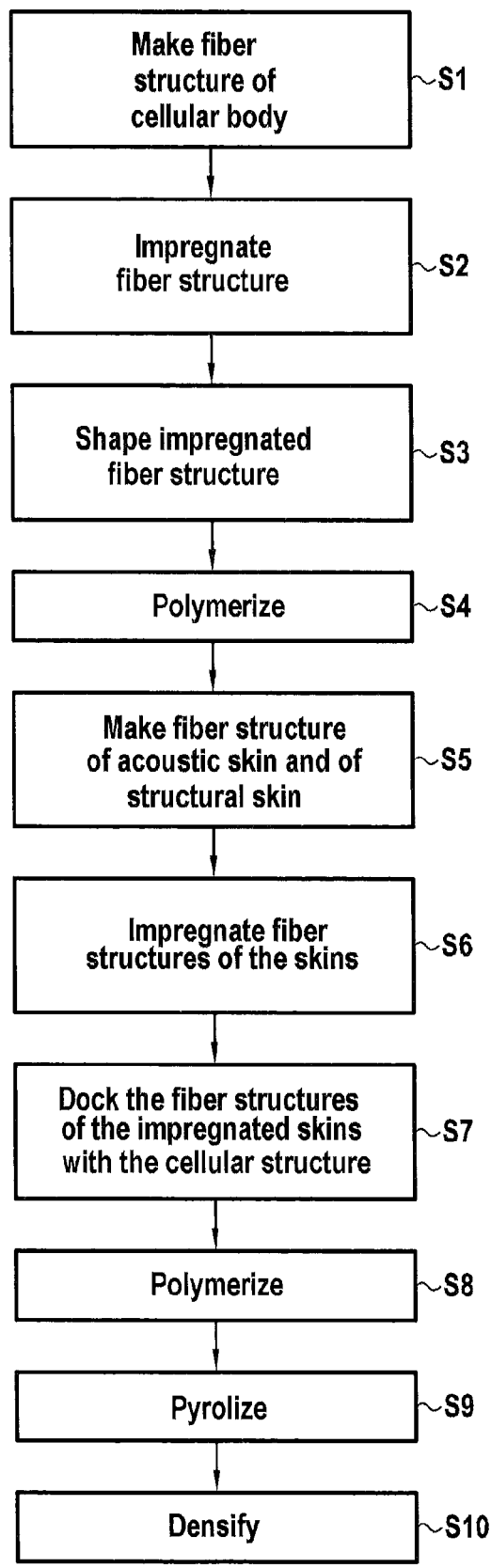
FIG. 2 is a flow chart of steps of a method of fabricating a sound attenuation panel of shape that is curved in accordance with an implementation of the invention.

In an implementation of the method of the invention as shown in FIG. 2, a sound attenuation panel is fabricated in accordance with the invention starting with making a cellular structure or cellular body that involves preparing a fiber structure of refractory fibers, in particular of carbon or ceramic fibers, so as to define a cellular structure (step S1) such as the fiber structure 100 shown in FIG. 3, which structure has vertical walls 101 defining cells 102 that are of hexagonal shape.

Figure 4A:
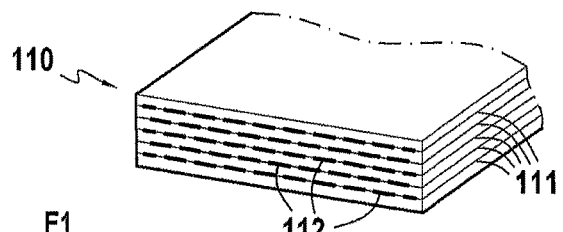
FIGS. 4A to 4C show the fabrication of an expandable fiber structure in accordance with an implementation of the invention.
Figure 4B:
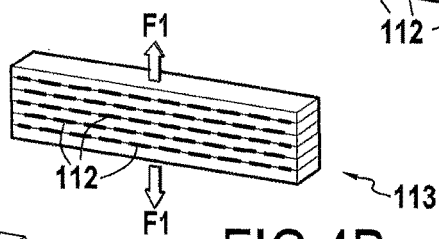
Figure 4C:
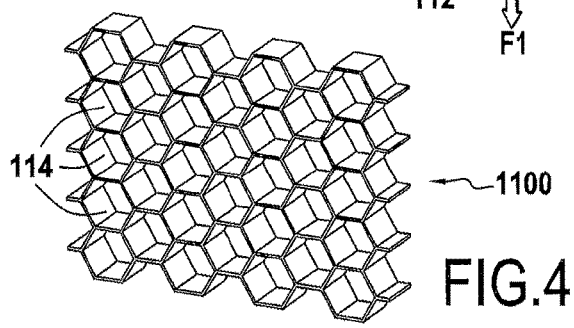

The fiber structure for forming the reinforcement of the cellular structure may be made in various ways, and in particular as described in Document U.S. Pat. No. 5,415, 715. In particular, and as shown in FIGS. 4A to 4C, it may be made by stacking and bonding together in staggered configuration plies of fabric 111, e.g. made of silicon carbide (SIC) fiber so as to form a texture 110. The bonding between the plies 111 is implemented along parallel strips 112, the strips 112 situated on one face of a ply being offset relative to those situated on the other face (FIG. 4A). The strips of bonding 112 between the plies 111 may be made in particular by adhesive or by stitching. The stack of plies is cut into segments 113, perpendicularly to the strips of adhesive (FIG. 4B). Each segment is then stretched in the direction normal to the faces of the plies (arrows f1 in FIG. 4B) so that on deforming cellular structures 1100 are produced that have hexagonal cells 114 (FIG. 4C) in this example.

Figure 5A:
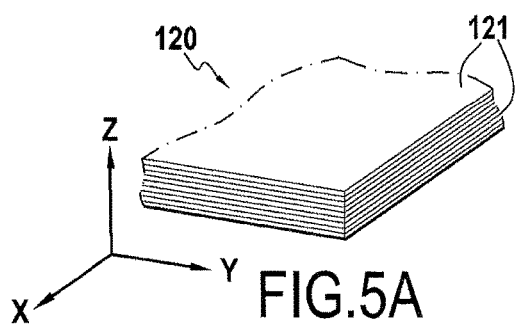
FIGS. 5A to 5C show the fabrication of an expandable fiber structure in accordance with another implementation of the invention.
Figure 5B:
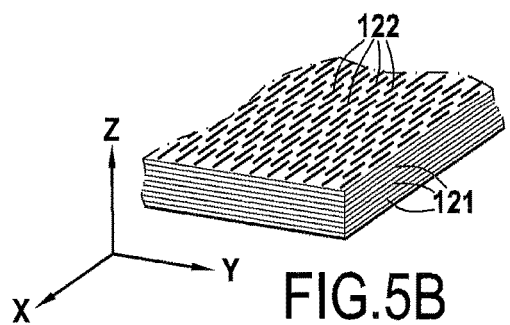
Figure 5C:
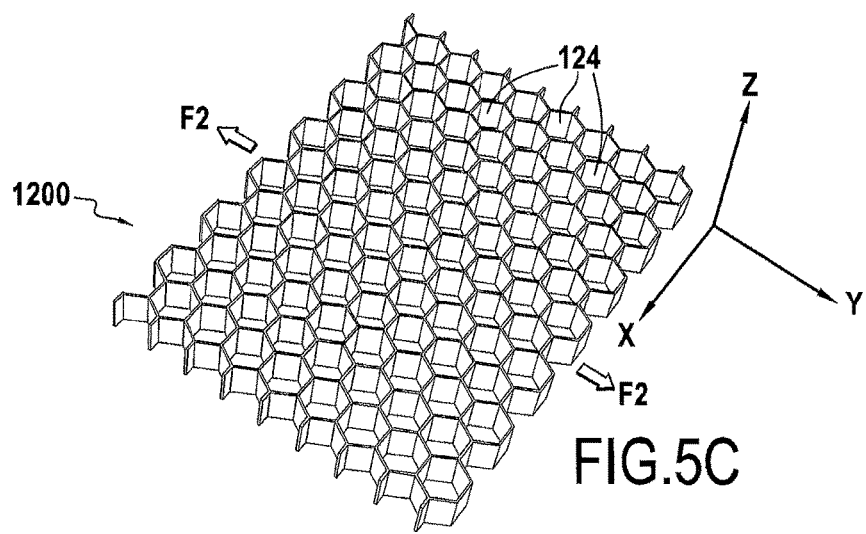

In the variant shown in FIGS. 5A to 5C, two-dimensional plies 121, e.g. made of SiC fibers, are superposed and needled together so as to form a texture 120 (FIG. 5A). The plies 121 are layers, e.g. of woven fabric or of complexes made up of woven fabric and a web of fibers, the web of fibers providing fibers that can easily be caught by the needles during needling so as to be implanted through the plies. As shown in FIG. 5B, cuts 122 in the form of slots are made in a staggered configuration in the texture 120, e.g. using a waterjet or a laser, with the cuts being of dimensions and locations that define the dimensions and the shapes of the cells. After the cuts have been made, the texture 120 is stretched in the direction perpendicular to the cutting planes (arrows f2 in FIG. 5C) so that, on being deformed, a cellular structure 1200 is produced that has hexagonal cells 124 in this example.

In yet another variant, the fiber structure that is to form the reinforcement of the cellular structure may be made by placing strips of woven fabric in the planes of the walls of the cells and bonding these strips together at the junctions between cells.

In yet another variant, an expandable fiber structure is made by three-dimensional or multilayer weaving.

Figure 6A:
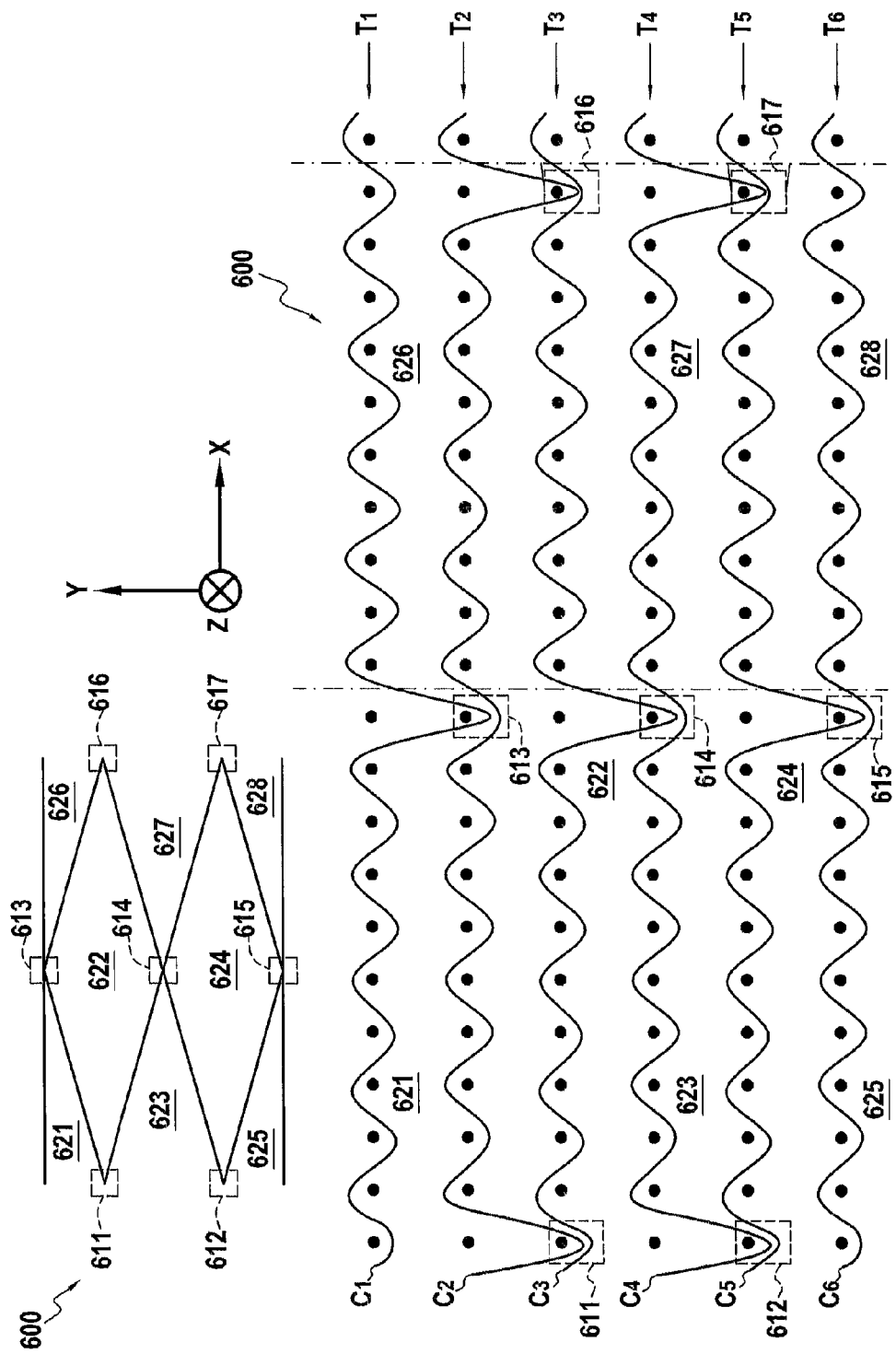
FIGS. 6A and 6B are respective enlarged views on two successive weave planes of a fiber structure that is expandable in accordance with an implementation of the invention.
Figure 6B:
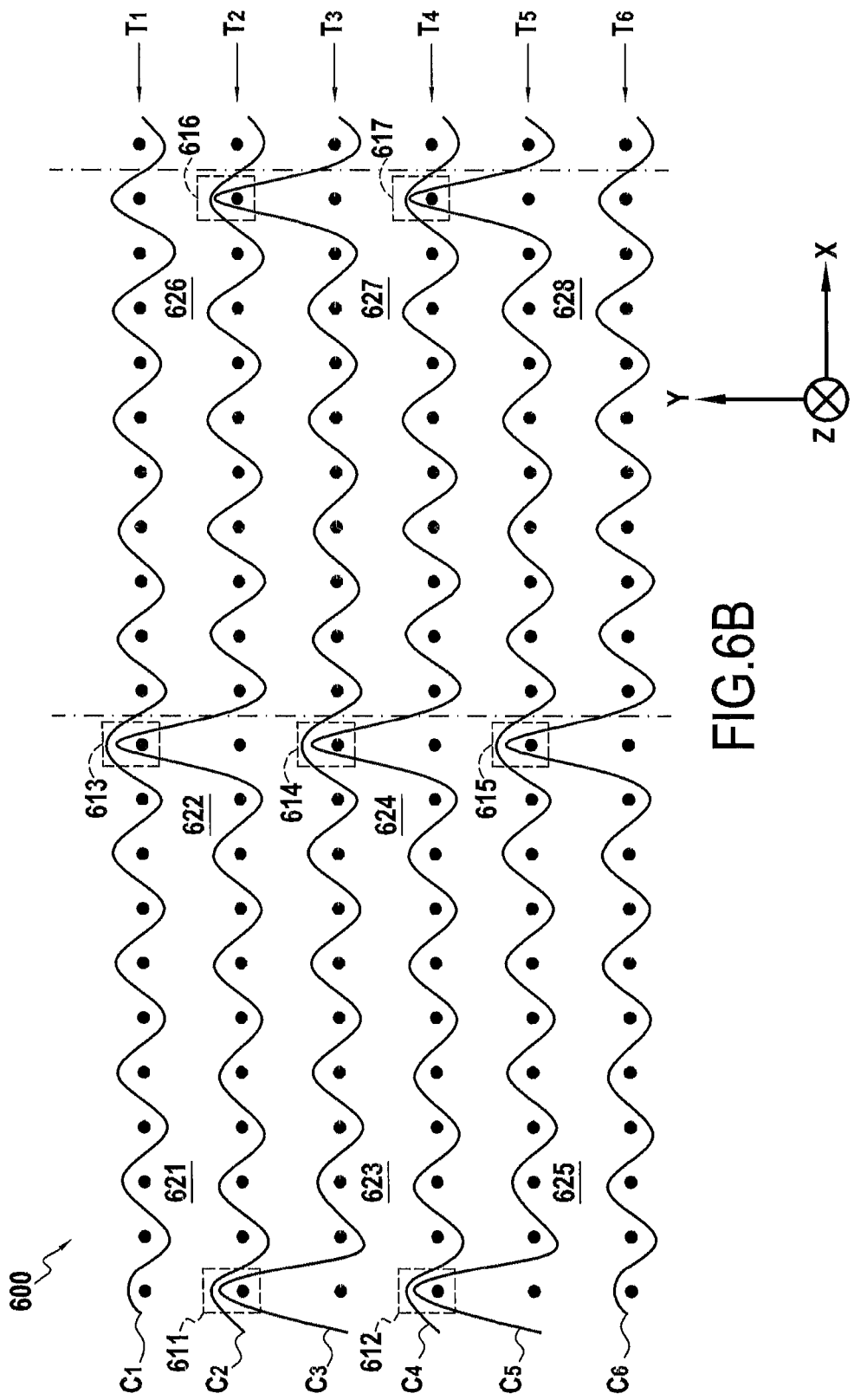
Figure 7A:
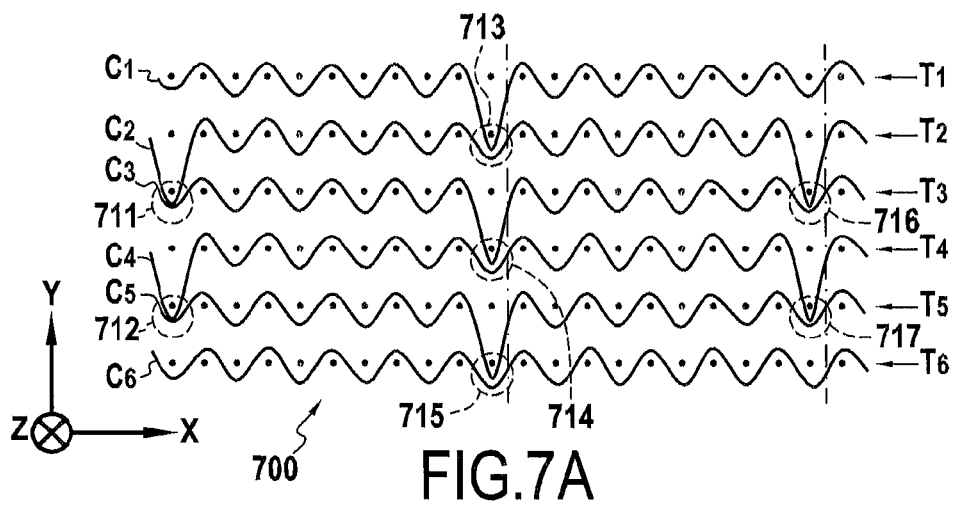
FIGS. 7A to 7L show weave planes for making a fiber structure of the same type as the fiber structure of FIGS. 6A and 6B, but in which the weft and warp yarns are oriented at 45° relative to the axes of the cells in accordance with another implementation of the invention.
Figure 7B:
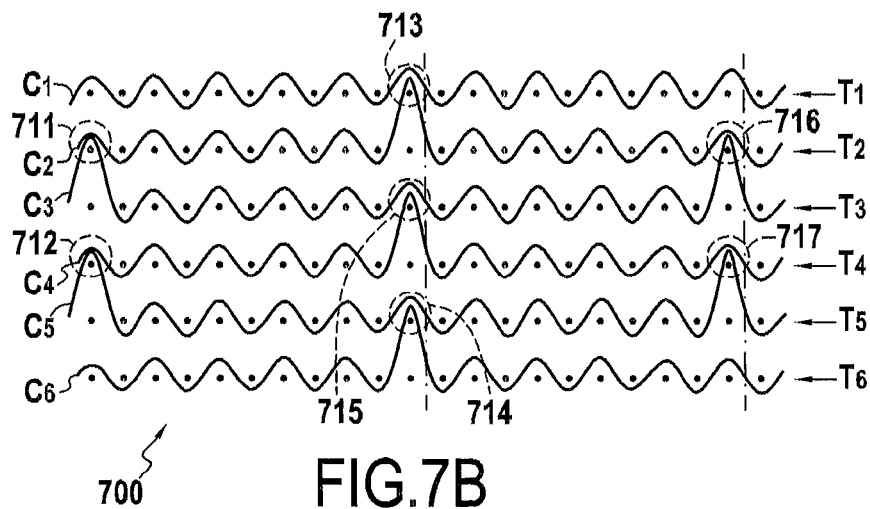
Figure 7C:
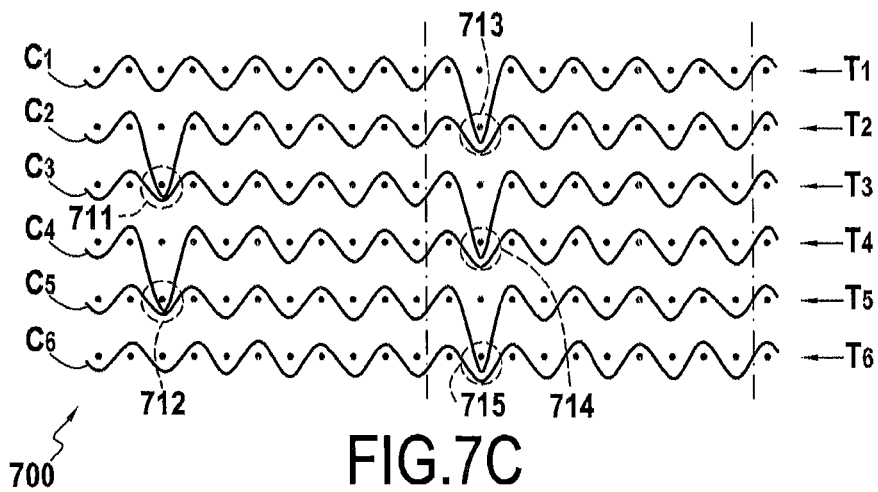
Figure 7D:
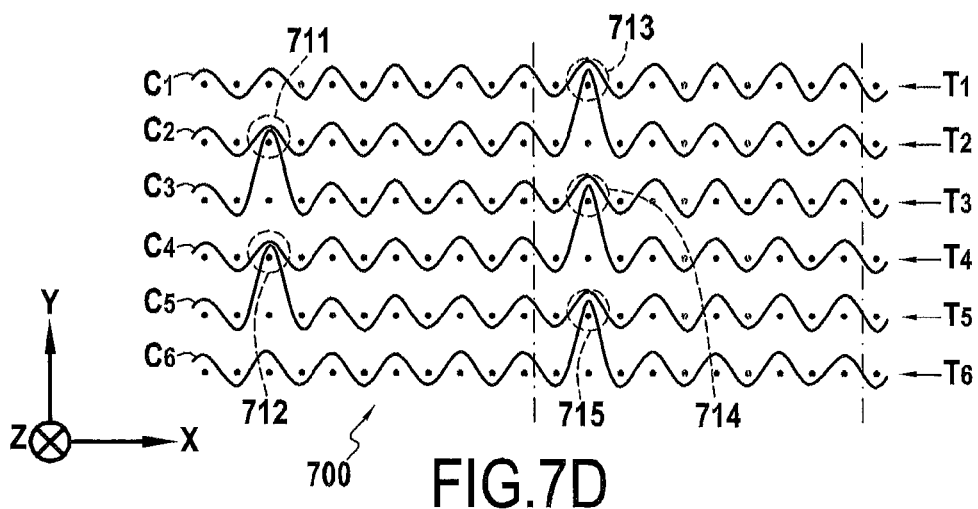
Figure 7E:
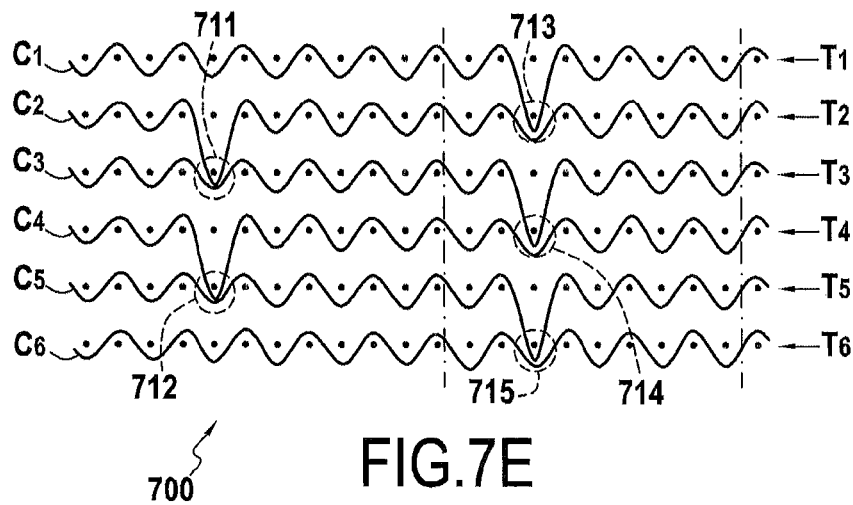
Figure 7F:
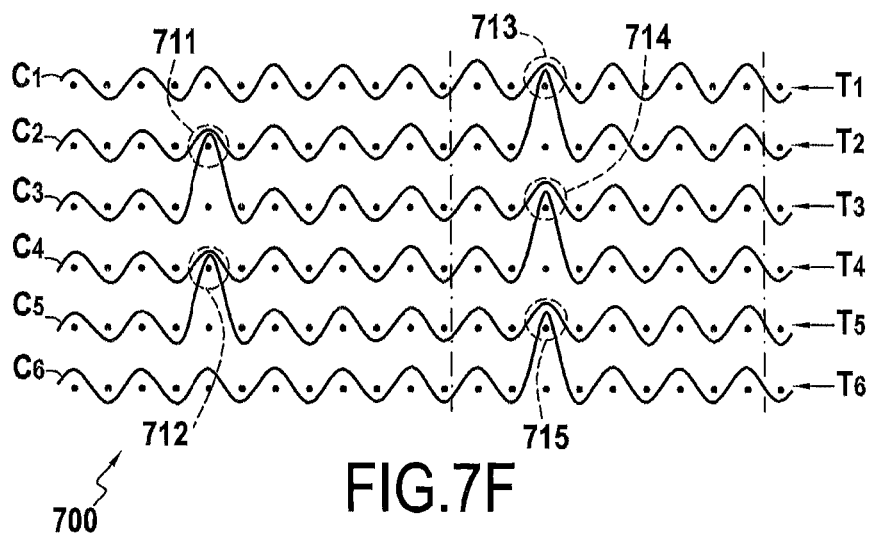
Figure 7G:
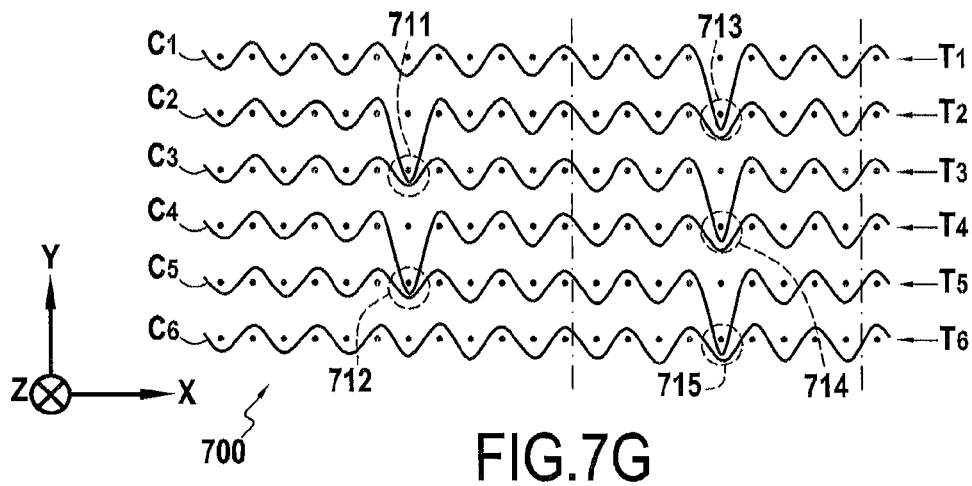
Figure 7H:
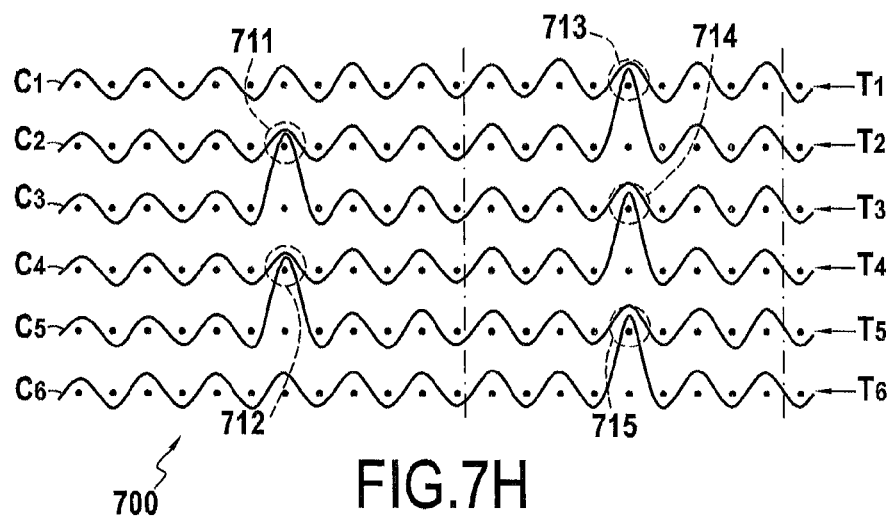
Figure 7I:
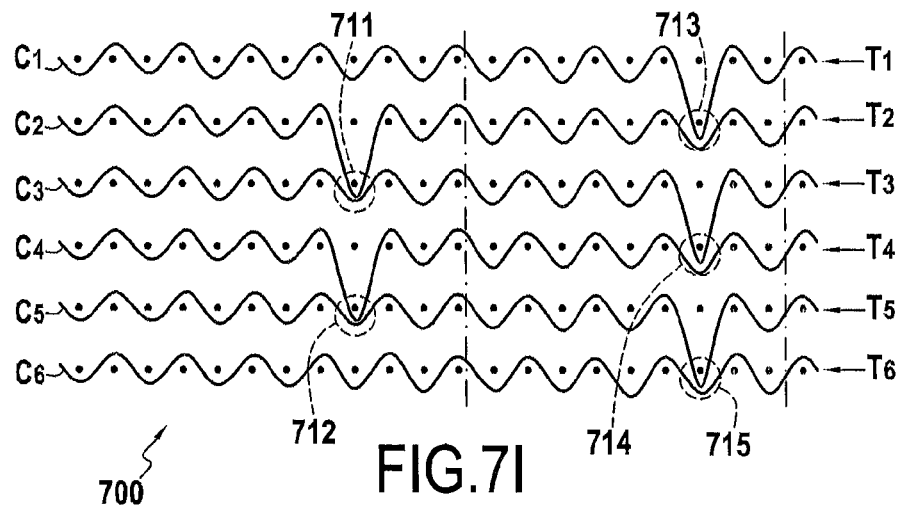
Figure 7J:
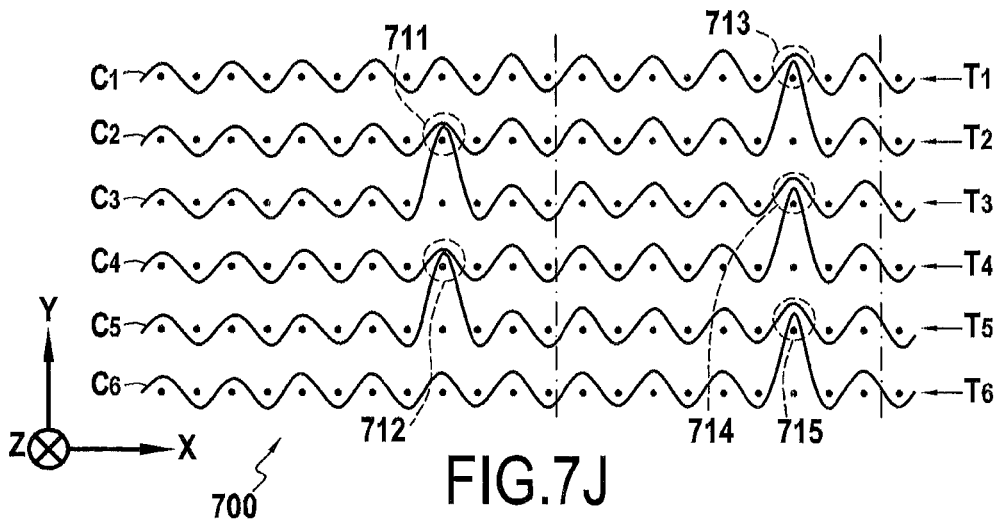
Figure 7K:
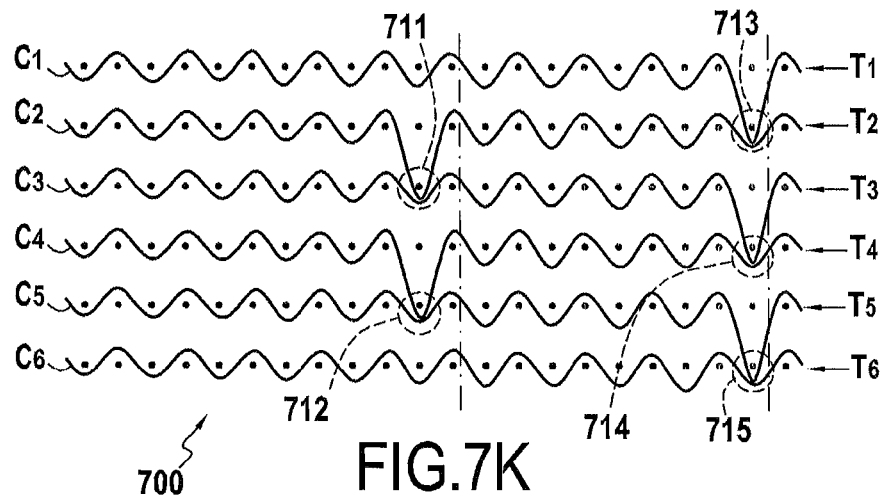
Figure 7L:
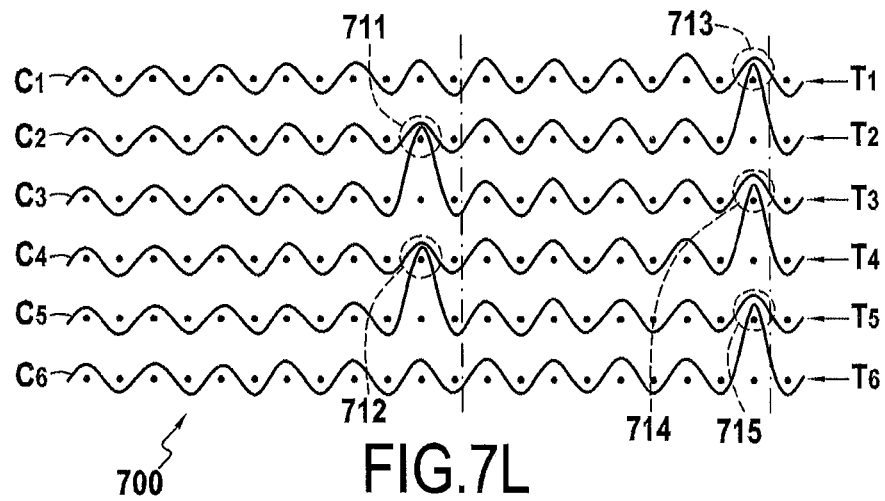

One way of making an expandable fiber structure 600 by multilayer weaving is shown diagrammatically in FIGS. 6A and 6B, which are respective enlarged views on two successive weave planes of a multi-plain type weave, the weft yarns being shown in section. In this example, the structure 600 has six layers of weft yarns T1 to T6 extending in a Z direction corresponding to the axis of the cells of the cellular structure. In FIGS. 6A and 6B, each layer of weft yarns is interlinked by warp yarns C1 to C6, each yarn belonging to a respective layer of warp yarns. The thickness of the fiber structure, and consequently the height of the cells subsequently formed by expanding the structure 600, extends in the direction Z and is determined by the length of the weft yarns woven together by the warp yarns, i.e. by the number of repeats of the planes of FIGS. 6A and 6B. The length and the width of the structure 600 are defined respectively by the number of woven layers of warp yarns (Y direction).

For simplification purposes, six layers of warp yarns and six layers of weft yarns are shown in this example. Naturally, depending on the dimensions (width and thickness) of the fiber structure that it is desired to obtain, the structure may be made with larger numbers of layers of warp yarns and of weft yarns, in particular in order to increase the number of cells in the Y direction of the fiber structure. Still for reasons of conciseness, only 22 weft yarns are shown in this example in order to show how two adjacent lozenge-shaped cells are made, as shown in FIG. 6A. Naturally, the number of weft yarns per layer may be larger in order to increase the number of cells in the X direction of the fiber structure.

Interlinking portions 611 to 617 are made between the yarns of two adjacent layers of weft yarns. These interlinking portions define zones of non-interlinking 621 to 628, each forming all or part of a cell once the fiber structure has been expanded.

The above-described fiber structure 600 is woven with its weft yarns parallel to the cell axes (0°), while the warp yarns are perpendicular to the cell axes (90°). Nevertheless, the weft yarns and warp yarns could be oriented differently relative to the cell axes. In particular, the fiber structures may be woven so that the weft and warp yarns are oriented at 45° relative to the cell axes, thus enabling the fiber structure to deform to a greater extent while it is being expanded, and thus facilitating good shaping on a warped surface.

FIGS. 7A to 7L show weave planes suitable for making a fiber structure 700 of the same type as the above-described structure 600, i.e. a fiber structure suitable for forming lozenge-shaped cells, but in which the warp and weft yarns are oriented at 45° relative to the axis of each cell. The weaving of the fiber structure 700 differs from that of the structure 600 in that the interlinking portions between two weft yarns are offset every two planes, in this example by two weft yarns, as shown for the interlinking portions 711 to 717 between FIGS. 7A and 7C, 7B and 7D, and 7C and 7E, etc.

The fiber structure that is to form the reinforcement of the cellular structure of the invention can also be made by multilayer or 3D interlock type weaving. The term "interlock weaving" is used herein to mean a multilayer or 3D weave in which each warp layer interlinks a plurality of weft layers with all of the yarns in the same warp column having the same movement in the weave plane with warp yarn crossing in the weft layers.

Once the fiber structure 100 has been made, it is impregnated with a liquid composition containing an organic precursor for a ceramic material (step S2). For this purpose, the fiber texture is immersed in a bath containing the resin, and usually a solvent for the resin. After draining, pre-curing (pre-polymerization) is performed in a stove. The drying needs to be performed at a temperature that is moderate in order to preserve sufficient deformability for the fiber texture.

Other known impregnation techniques may be used, such as passing the fiber texture continuously through an impregnating machine, impregnation by infusion, or indeed by resin transfer molding (RTM).

The organic precursor is usually in the form of a polymer, such as a resin, possibly diluted in a solvent. By way of example, liquid precursors for ceramic, and in particular for SiC, may be resins of the polycarbosilane (PCS), polysiloxane (PSX), polytitanocarbosilane (PTCS), or polysilazane (PSZ) type, while a liquid precursor for carbon may be a resin of phenolic type.

Figure 8:
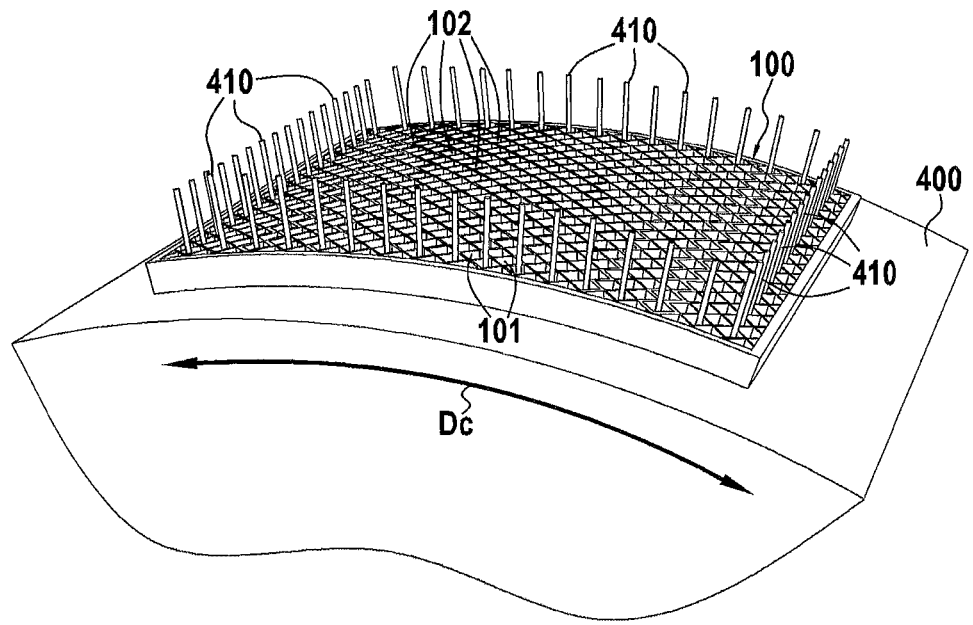
FIG. 8 is a diagrammatic perspective view showing a fiber structure being expanded on shaper tooling.

The impregnated fiber structure 100 is then expanded and shaped by being shaped on support tooling 400 that presents a shape that is curved in a direction Dc corresponding to the final shape of the cellular body to be fabricated, which is itself close to the shape of the part on which the sound attenuation panel is to be mounted (step S3, FIG. 8). In the presently-described embodiment, the supporting tooling 400 is cylindrical in shape and has pegs 410 for holding the structure in position on the tooling 400.

Figure 9:
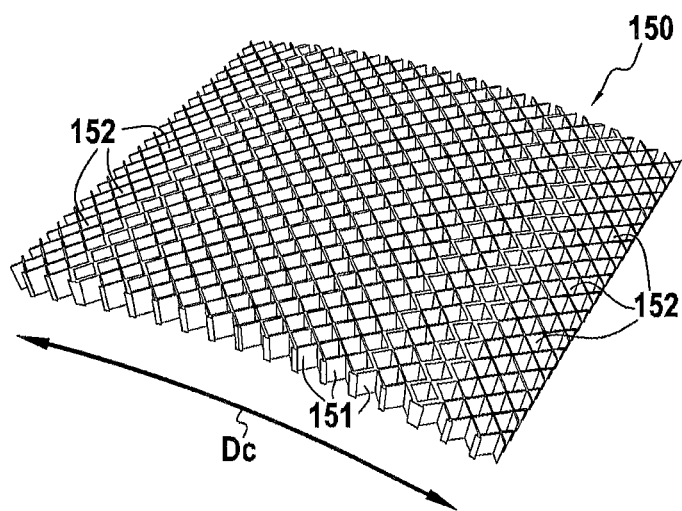
FIG. 9 is a perspective view of a curved cellular structure used for a sound attenuation panel in accordance with an implementation of the invention.

After the fiber structure 100 has been expanded and shaped on the tooling 400, the resin impregnating the fiber structure 100 is polymerized in order to impart a degree of mechanical strength thereto, enabling it to conserve its shape while being handled (step S4). A cellular structure 150 is thus obtained that presents a curved shape and that has a plurality of cells 152 defined by walls 151 (FIG. 9).

Figure 10:
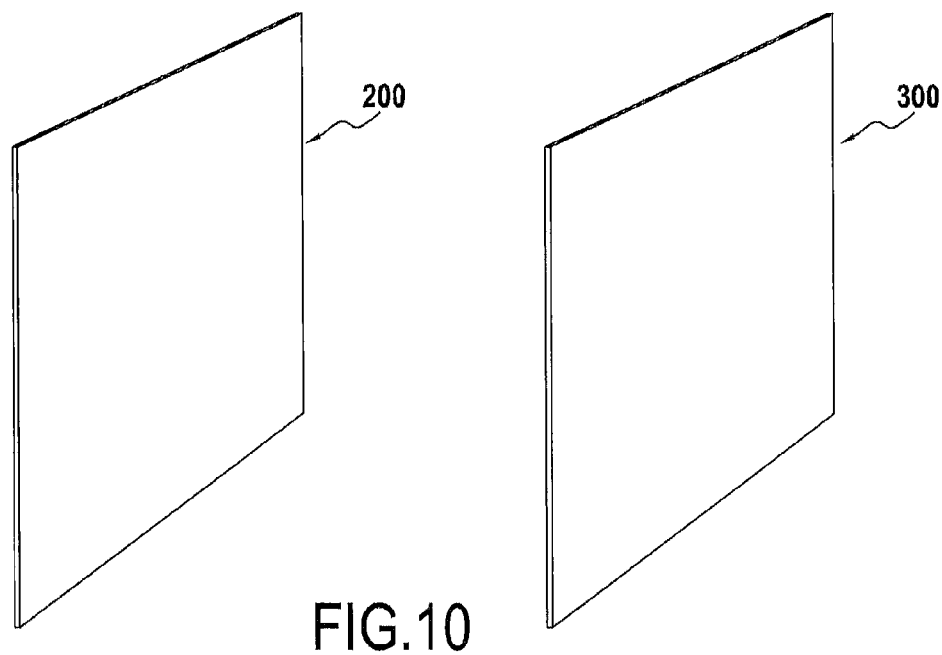
FIG. 10 is a diagrammatic view showing two fiber structures that are to form panels of a sound attenuation panel in accordance with an implementation of the invention.

Thereafter, two plane fiber structures are made that are to form first and second skins, namely an inner skin and an outer skin, for the acoustic panel (step S5). For this purpose, two fiber structures 200 and 300 are prepared as shown in FIG. 10. The fiber structures of the skins may be obtained from fiber textures made of refractory fibers (carbon or ceramic fibers). The fiber textures used may be of various kinds and shapes, such as in particular:

two-dimensional (2D) weaving;
three-dimensional (3D) weaving, obtained by 3D or multilayer weaving, such as described in particular in Document WO 2010/061140, the content of which is incorporated herein by reference;
knitting;
felting;
a unidirectional (UD) sheet of yarns or tows or multidirectional (nD) sheets obtained by superposing a plurality of UD sheets in different directions and bonding the UD sheets together, e.g. by stitching, by using a chemical bonding agent, or by needling.

It is also possible to use a fiber structure made up of a plurality of superposed layers of woven fabric, braiding, knitting, felt, yarn sheets, tows, etc., which layers are bonded together, e.g. by stitching, by implanting yarns or rigid elements, or by needling.

Once the fiber structures 200 and 300 have been made, they are impregnated with a solid composition containing at least an organic resin that is a precursor for a ceramic material, using one of the impregnation techniques described above (step S6).

The following step consists in docking two skins with the cellular body. As described above, each skin may be docked to the cellular body while at the impregnated stage or while at the polymerized stage.

Figure 11:
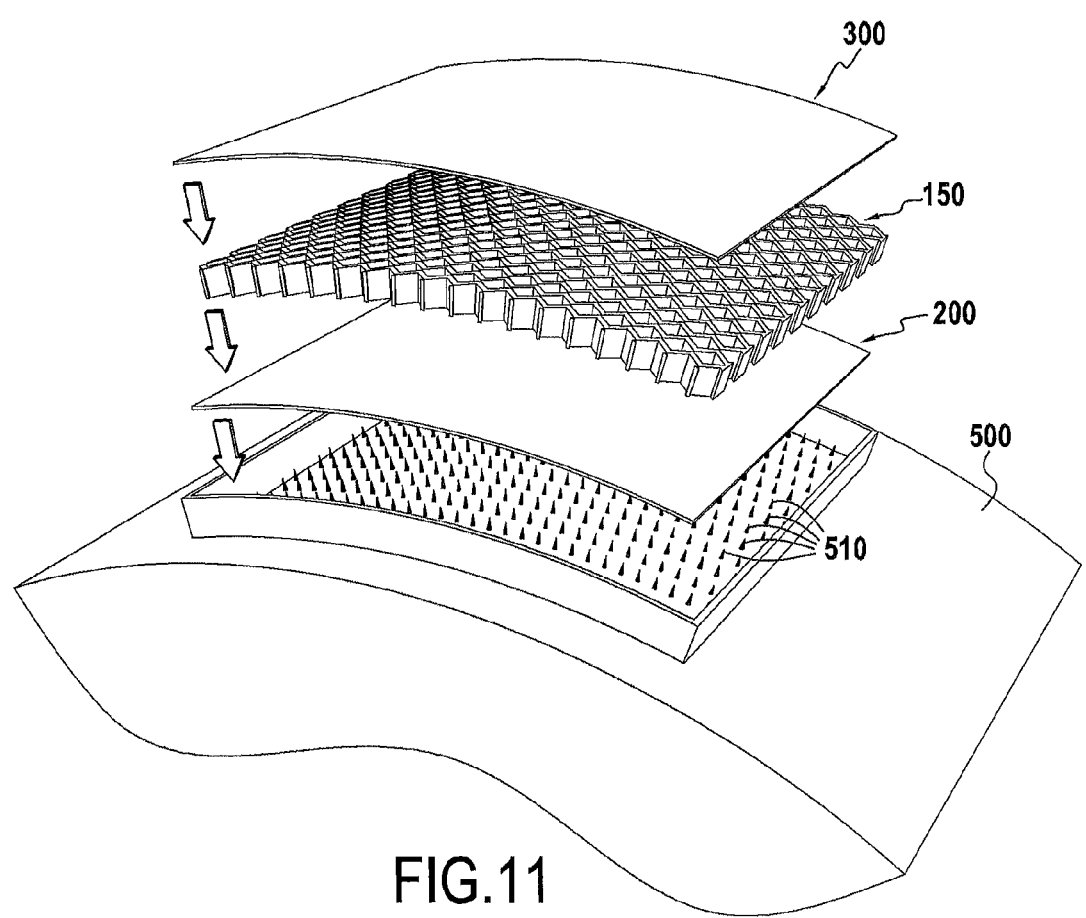
FIG. 11 is a diagrammatic exploded perspective view showing skins at the impregnated stage being assembled with a cellular structure at the polymerized stage.

In a first implementation of the invention, the fiber structures 200 and 300 are docked with the cellular structure 150 at the impregnated stage, i.e. before polymerizing the organic precursor resin (step S7). For this purpose, and as shown in FIG. 11, the fiber structure 200 is placed on tooling 500 that, like the tooling 400, presents a curved shape corresponding to the shape of the acoustic panel that is to be fabricated and to the shape of the part on which the panel is to be mounted. The tooling 500 also has a plurality of needles 510 on its surface for making perforations in the fiber structure 200. The cellular structure 150 is then placed on the impregnated fiber structure 200. The impregnated fiber structure 300 is then placed on the top portion of the cellular body that constitutes a shaping support for the structure 300, given that it has already been consolidated. The resin impregnating the fiber structures 200 and 300 is polymerized so as to give them sufficient strength to enable them to conserve their shape during subsequent operations (step S8). Two panels are thus obtained with the cellular structure interposed between them. In order to increase the bonding between the skins and the cellular body, adhesive may be placed between the contacting portions of these elements. By way of example, the adhesive used may be constituted by a mixture of a pre-ceramic resin (40% by weight) and a filler of silicon carbide having a grain size of about 9 micrometers (μm) (60% by weight). The adhesive may be applied by dipping the cellular structure in a bath of adhesive or by applying the adhesive in the form of a slurry on the cellular structure. It is also possible to use any other adhesive based on a ceramic precursor and presenting good high-temperature strength.

The assembly is then subjected to pyrolysis treatment under an inert gas so as to transform the polymer matrix into ceramic (step S9).

At this stage, the cellular structure and the skins still present porosity that is subsequently reduced to a determined level by the well-known technique of chemical vapor infiltration (CVI) using silicon carbide. For this purpose, the assembly constituted by the cellular structure and the skins is placed in an oven into which a reaction gas is admitted. The pressure and the temperature in the oven and the composition of the gas are selected so as to enable the gas to diffuse within the pores of the parts so as to form a matrix therein by depositing a solid material that results either from a component of the gas decomposing, or else from a reaction between a plurality of its components. By way of example, gaseous precursors of ceramic, in particular of SiC, may be methyltrichlorosilane (MTS), which gives SiC by the MTS decomposing (possibly in the presence of hydrogen).

This co-densification of the parts of the sound attenuation panel provides final bonding between the parts.

A sound attenuation panel 10 as shown in FIG. 1 is thus obtained that presents a shape that is curved and that has a cellular structure 11 arranged between an acoustic panel 12 having perforations 13 and a structural panel 14, all of these elements being made of CMC material.

The skins may be docked to the cellular structure in various ways. In the above-described example, the skins are both docked to the cellular structure while they are in the impregnated stage, i.e. prior to polymerizing the resin impregnating the fiber structures that are to form the skins.

In a variant implementation of the method of the invention, a first skin, e.g. the acoustic skin, is docked to the bottom portion of the cellular structure while it is in the impregnated stage, and it is then subjected to polymerization treatment. The second skin, e.g. the structural skin in this example, is then docked to the top portion of the cellular structure while it is in the impregnated stage and prior to being subjected to polymerization treatment. An adhesive of the above-described type may be arranged between the contacting portions of the cellular structure and of the skins. In addition, once the acoustic skin has been docked and polymerized, perforations can be made therein, e.g. by mechanical drilling, or by using a laser or a waterjet, prior to docking the second structural skin. This makes it possible to machine the perforations in the acoustic skin without running any risk of damaging the structural skin.

In another variant implementation of the method, one of the two skins, or both of the skins, is/are subjected to polymerization treatment prior to docking with the cellular structure. Under such circumstances, the impregnated fiber structure(s) for forming the skin(s) is/are subjected to polymerization treatment while being held on shaping tooling having a curved shape corresponding to the shape of the cellular structure. The skin(s) as consolidated in this way is/are then docked to the cellular structure with an adhesive of the above-described type being interposed between the contacting portions of the cellular structure and the skins.

The acoustic skin, i.e. the skin having perforations, is placed on the bottom or the top of the cellular structure, depending on the sound attenuation requirements of the panel. The perforations in the acoustic skin may be made at various stages and in various ways. When the perforations are made in the fiber structure at the impregnated stage, the structure is subjected to polymerization treatment while placed on tooling having a plurality of needles serving to form openings in the structure so as to constitute perforations after polymerization as described above (FIG. 11).

The perforations may also be made in the acoustic skin after it has been subjected to polymerization, to pyrolysis, or to CVI densification. Under such circumstances, the perforations are made by mechanical drilling, by laser, by jet of water under pressure, etc.

The sound attenuation panel of the invention may be used in general in any exhaust duct of a gas turbine. In particular, different portions of an aeroengine nozzle such as the exhaust duct of a turbojet may be fitted therewith. It is also possible for it to be used on the inside surface of an aeroengine nacelle in order to attenuate the soundwaves propagating from the engine core. The sound attenuation panel of the invention may also advantageously be used in thrust reversers of aeroengines, and in particular for the scopes of such thrust reversers.

The shape and the dimensions of the panel are defined as a function of the part on which the panel is to be mounted and of the zone where it is desired to provide sound attenuation.

Making the sound attenuation panel out of ceramic matrix composite material serves to reduce the weight of the part, while also providing structural strength at high temperature (higher than 700° C.). By way of example, in an exhaust system, the use of CMC sound attenuation panels in the exhaust cone and in the nozzle makes it possible to incorporate the sound attenuation function in the afterbodies of aeroengines without penalizing the weight of the ejection system.

The invention claimed is:

1. A method of fabricating a sound attenuation panel of curved shape, the method comprising:

impregnating a fiber structure defining a cellular structure with a ceramic precursor resin;

polymerizing the ceramic precursor resin while holding the fiber structure on a tooling presenting a curved shape corresponding to a final shape of the cellular structure;

docking the cellular structure with first and second skins so as to close the cells of said cellular structure, each skin being formed by a fiber structure impregnated with a ceramic precursor resin, each skin being docked to said cellular structure before or after polymerizing the resin of said first and second skins and each skin being docked to said cellular structure before subjecting said cellular structure to any pyrolysis treatment;

pyrolyzing an assembly constituted by the cellular structure and the first and second skins; and densifying said assembly by chemical vapor infiltration.

2. A method according to claim 1, wherein at least one of the first and second skins is docked to the cellular structure prior to polymerizing the impregnation resin of the skin, the method further comprising polymerizing the resin of said skin after the docking and before the pyrolyzing.

3. A method according to claim 2, wherein one of the first and second skins is placed on tooling having needles passing through the skin, the cellular structure being docked with said skin placed on the tooling so as to make perforations in said skin.

4. A method according to claim 1, wherein the resin of at least one of the first and second skins is polymerized before docking with the cellular structure, said skin being held during polymerization on the tooling that presents a curved shape similar to the curved shape of the cellular structure, and wherein an adhesive including at least a ceramic precursor resin is placed on portions of the cellular structure that are to come into contact with the skin.

5. A method according to claim 4, wherein the adhesive further includes a solid filler constituted by a powder of a refractory material.

6. A method according to claim 1, wherein the first skin is docked to the cellular structure, the method further comprising, prior to docking the second skin to the cellular structure, making multiple perforations in the first skin, the second skin being docked to the cellular structure after said making multiple perforations.

7. A method according to claim 1, further comprising making an expandable fiber structure defining a cellular structure.

8. A method according to claim 7, wherein the expandable fiber structure is made by three-dimensional weaving or by multilayer weaving.

9. A method according to claim 1, wherein the fiber structures of the cellular body and of the skins are made from silicon carbide fibers.

10. A method according to claim 1, wherein the impregnation resin of the cellular structure and of the skins is a silicon carbide precursor resin, and wherein the densifying comprises chemical vapor infiltration of silicon carbide.

11. A method of fabricating a sound attenuation panel of curved shape, the method comprising:

impregnating a fiber structure defining a cellular structure with a ceramic precursor resin;

polymerizing the ceramic precursor resin while holding the fiber structure on a tooling presenting a curved shape corresponding to a final shape of the cellular structure;

docking the cellular structure with first and second skins so as to close the cells of said cellular structure, each skin being formed by a fiber structure impregnated with a ceramic precursor resin, each skin being docked to said cellular structure before or after polymerizing the resin of said first and second skins;

pyrolyzing an assembly constituted by the cellular structure and the first and second skins, said pyrolyzing being the only pyrolysis treatment applied to said cellular structure and to said first and second skins before densifying said assembly; and densifying said assembly by chemical vapor infiltration.

12. A method according to claim 11, wherein at least one of the first and second skins is docked to the cellular structure prior to polymerizing the impregnation resin of the skin, the method further comprising polymerizing the resin of said skin after the docking and before the pyrolyzing.

13. A method according to claim 12, wherein one of the first and second skins is placed on tooling having needles passing through the skin, the cellular structure being docked with said skin placed on the tooling so as to make perforations in said skin.

14. A method according to claim 11, wherein the resin of at least one of the first and second skins is polymerized before docking with the cellular structure, said skin being held during polymerization on the tooling that presents a curved shape similar to the curved shape of the cellular structure, and wherein an adhesive including at least a ceramic precursor resin is placed on portions of the cellular structure that are to come into contact with the skin.

15. A method according to claim 14, wherein the adhesive further includes a solid filler constituted by a powder of a refractory material.

16. A method according to claim 11, wherein the first skin is docked to the cellular structure, the method further comprising, prior to docking the second skin to the cellular structure, making multiple perforations in the first skin, the second skin being docked to the cellular structure after said making multiple perforations.

17. A method according to claim 11, further comprising making an expandable fiber structure defining a cellular structure.

18. A method according to claim 17, wherein the expandable fiber structure is made by three-dimensional weaving or by multilayer weaving.

19. A method according to claim 11, wherein the fiber structures of the cellular body and of the skins are made from silicon carbide fibers.

20. A method according to claim 11, wherein the impregnation resin of the cellular structure and of the skins is a silicon carbide precursor resin, and wherein the densifying comprises chemical vapor infiltration of silicon carbide.

* * * * *